United States Patent
Song

[19]

[11] Patent Number: 6,031,284

[45] Date of Patent: Feb. 29, 2000

[54] PACKAGE BODY AND SEMICONDUCTOR CHIP PACKAGE USING SAME

[75] Inventor: Chi-Jung Song, Daejon, Rep. of Korea

[73] Assignee: LG Semicon Co., Ltd., Cheongju, Rep. of Korea

[21] Appl. No.: 09/021,829

[22] Filed: Feb. 11, 1998

[30] Foreign Application Priority Data

Mar. 14, 1997 [KR] Rep. of Korea .......................... 97-8653

[51] Int. Cl.⁷ .................................................. H01L 23/053
[52] U.S. Cl. ............................ 257/701; 257/778; 257/686
[58] Field of Search .................................. 257/686, 723, 257/778, 704, 700, 701, 737, 738

[56] References Cited

U.S. PATENT DOCUMENTS

| | | | |
|---|---|---|---|
| 5,043,794 | 8/1991 | Tai et al. ................................... | 257/686 |
| 5,241,133 | 8/1993 | Mullen, III et al. ..................... | 174/52.4 |
| 5,355,283 | 10/1994 | Marrs et al. .............................. | 361/760 |
| 5,838,061 | 11/1998 | Kim .......................................... | 257/686 |

*Primary Examiner*—Carl Whitehead, Jr.
*Assistant Examiner*—Roy Potter
*Attorney, Agent, or Firm*—Fleshner & Kim

[57] ABSTRACT

A package for housing an electronic device without the use of wire bonds includes a package body with a first cavity formed in its top surface, and a second cavity formed in a bottom surface of the first cavity. A plurality of signal lines in the package body connect the bottom surface of the second cavity to the bottom surface of the package body. A semiconductor chip package incorporating the package of the present invention further includes a semiconductor chip mounted in the package body. Bonding pads on the semiconductor chip are connected to the signal lines on the bottom surface of the second cavity via electrically conductive bumps.

31 Claims, 3 Drawing Sheets

6,031,284

PACKAGE BODY AND SEMICONDUCTOR CHIP PACKAGE USING SAME

BACKGROUND OF THE INVENTION

1. Field of the Invention

The present invention relates to a package for housing an electronic device and, more particularly, to an improved package body and semiconductor chip package that does not use a substrate or metallic wires.

2. Background of the Related Art

A ball grid array (hereinafter, "BGA") semiconductor chip package employs a plurality of solder balls as external terminals. Such a BGA package is widely employed because it allows a multi-pin structure over a limited area. The external terminals in the related BGA package are sufficiently short to prevent bending by an external impact, while facilitating the transmission of electrical signals. In addition, the package is momentarily reflowed in a furnace when it is mounted on a motherboard, thereby shortening the mounting time.

As shown in FIG. 1, the related BGA package includes: a substrate 1; a semiconductor chip 3 fixedly mounted by an adhesive 2 on a central surface of the substrate 1; a plurality of chip pads 3a formed on an upper surface of the chip 3; a plurality of metallic wires 4 respectively connecting corresponding ones of the chip pads 3a to a metallic pattern (not shown) in the substrate 1; a molding compound 5 formed on the substrate 1 so as to cover the chip 3 and the metallic wires 4; and a plurality of solder balls 6 attached to a lower surface of the substrate 1.

The fabrication method of the related BGA package includes the steps of: a die bonding step for fixedly attaching the semiconductor chip 3 to the upper surface of the substrate 1; a wire bonding step for connecting metallic patterns (not shown) formed on the substrate 1 to corresponding chip pads 3a formed on the upper surface of the chip 3 with corresponding metallic wires 4; a molding step for forming the molding compound 5 to surround the chip 3 and the metallic wires 4 using an epoxy resin; and a solder ball attaching step for attaching the plurality of solder balls 6 on the lower surface of the substrate 1.

The size of the related BGA package is limited by the fact that the metallic wires 4 should have a constant loop height. Further, it is difficult and time consuming to carry out the wire bonding step for connecting the chip pads 3a to the metallic pattern (not shown) on the substrate 1 using respective metallic wires 4. This reduces the efficiency of the fabrication process.

SUMMARY OF THE INVENTION

Therefore, it is an object of the present invention to provide a package body and a semiconductor chip package that does not use a substrate or metallic wires, in order to minimize its size and thickness.

It is another object of the present invention to provide package body and a semiconductor chip package that can be efficiently fabricated by excluding a wire bonding step that would otherwise require a considerable amount of time.

The present invention can be achieved in whole or in part by a package for housing an electronic device comprising: (1) a package body; (2) a first cavity formed in a top surface of the package body; (3) a second cavity formed in a bottom surface of the first cavity; and (4) a plurality of metallic patterns connecting a bottom surface of the second cavity to a bottom surface of the package body.

The present invention can also be achieved in whole or in part by a semiconductor chip package comprising: (1) a package body; (2) a first cavity formed in a top surface of the package body; (3) a second cavity formed in a bottom surface of the first cavity: (4) a plurality of metallic patterns connecting a bottom surface of the second cavity to a bottom surface of the package body; (5) a semiconductor chip having a plurality of bonding pads attached thereon and a plurality of electrically conductive bumps attached on the bonding pads, wherein the electrically, conductive bumps are connected to corresponding ones of the metallic patterns; (6) a filling agent formed in the second cavity; and (7) a molding compound formed in the first cavity.

Additional advantages, objects, and features of the invention will be set forth in part in the description which follows and in part will become apparent to those having ordinary skill in the art upon examination of the following, or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Reference will now be made in detail to the preferred embodiments of the present invention, examples of which are illustrated in the accompanying drawings.

Figure 1:
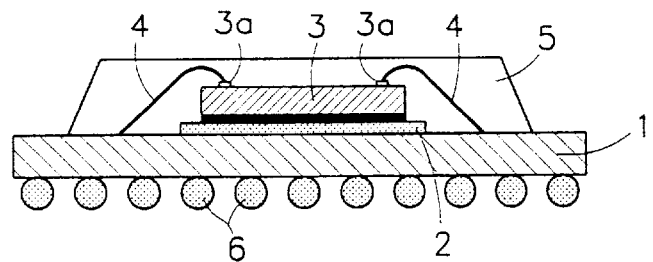
FIG. 1 is a cross-sectional view of related BGA package.
Figure 2:
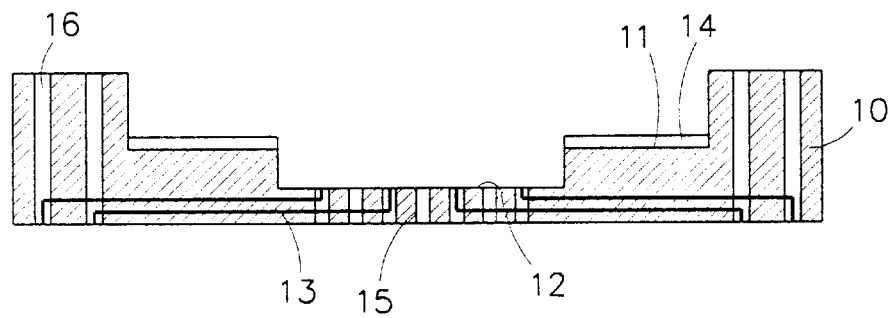
FIG. 2 is a cross-sectional view of a package body in accordance with the present invention.

As shown in FIG. 2, which is a cross-sectional view of a package body 10 in accordance with the present invention, in the upper surface of the package body 10 there is formed a first cavity 11, preferably square-shaped. A second cavity 12, preferably square-shaped, is formed in the bottom of the first cavity 11. A plurality of signal lines 13, preferably metallic patterns, are formed through a lower portion of the package body 10 and extend from the second cavity 12 to the bottom surface of the package body 10.

The second cavity 12 is formed smaller than the first cavity 11. Each end of the signal lines 13 embedded in the package body 10 is exposed at the bottom of the second cavity 12 and at the lower surface of the package body 10. A metallic plate 14 is formed on the remaining bottom surface of the first cavity 11. A plurality of first through holes 15 are formed to extend from the bottom surface of the second cavity 12 to the lower surface of the package body 10. Also, a plurality, of second through holes 16 are vertically formed in a peripheral portion of the package body 10 and extend from the top of the package body 10 to the bottom of the package body 10.

Figure 3:
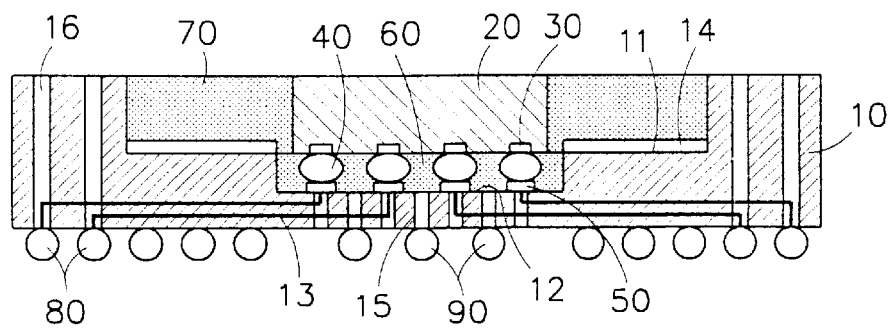
FIG. 3 is a cross-sectional view of a semiconductor chip package in accordance with the present invention.

FIG. 3 illustrates a completed semiconductor chip package according to the present invention. As shown therein, the chip package includes a package body 10 embedded with a plurality of signal lines 13, and a semiconductor chip 20 mounted in the package body 10.

FIGS. 4A–4F are cross-sectional views illustrating fabrication steps for the semiconductor chip package of the present invention.

Figure 4A:
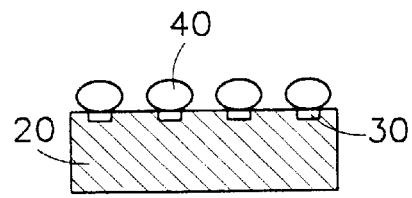
FIGS. 4A–4E are cross-sectional views illustrating fabrication steps for the semiconductor chip package of the present invention.

First, with reference to FIG. 4A, a plurality of electrically conductive bumps 40 are formed on corresponding ones of a plurality of bonding pads 30 formed on a semiconductor chip 20. Such a bumping step is carried out on a wafer (not shown) from which a plurality of semiconductor devices or chips are obtained.

Figure 4B:
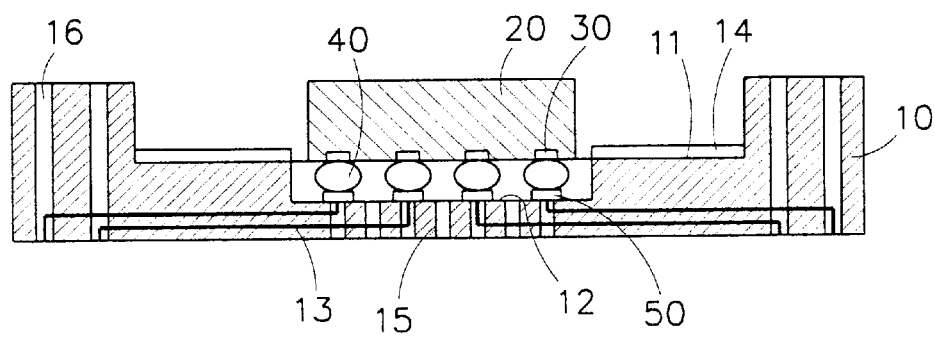

As shown in FIG. 4B, the bumped semiconductor chip 20 is mounted to a plurality of anisotropic materials 50 on the upper ends of the signal lines 13, which are exposed at the bottom of the second cavity 12 of the package body 10.

Figure 4C:
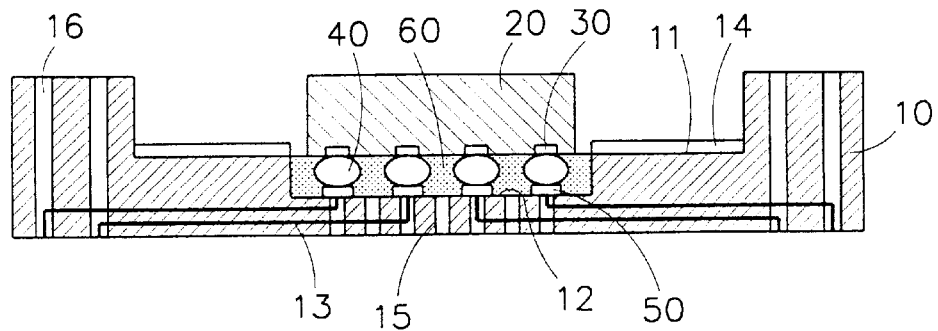

As further shown in FIG. 4C, a low viscosity liquid sealing agent 60, i.e., a filling agent, is formed between the lower surface of the semiconductor chip 20 and the bottom of the second cavity 12 by use of an underfill technique in order for the bumps 40 to be stationary in the second cavity 12. Here, the upper surface of the liquid sealing agent 60 is preferably even with the bottom surface of the first cavity 11.

Figure 4D:
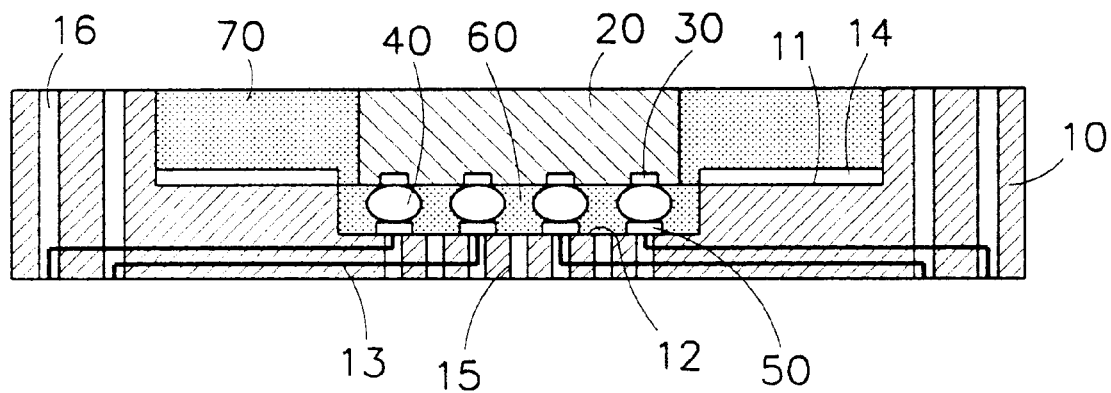

Referring to FIG. 4D, the first cavity 11 of the package body 10 is filled with a molding compound 70, preferably an epoxy molding compound. The upper surface of the mounted semiconductor chip 20 is preferably not covered by the molding compound 70, thereby exposing the upper surface of the semiconductor chip 20. A material for improving the adhesion between the package body 10 and the molding compound 70, preferably a metallic plate 14, is formed on the bottom of the first cavity 11. Also, the upper surface of the mounted semiconductor chip 20, the peripheral upper surface of the package body 10 and the upper surface of the molding compound 70 are preferably co-planar.

Figure 4E:
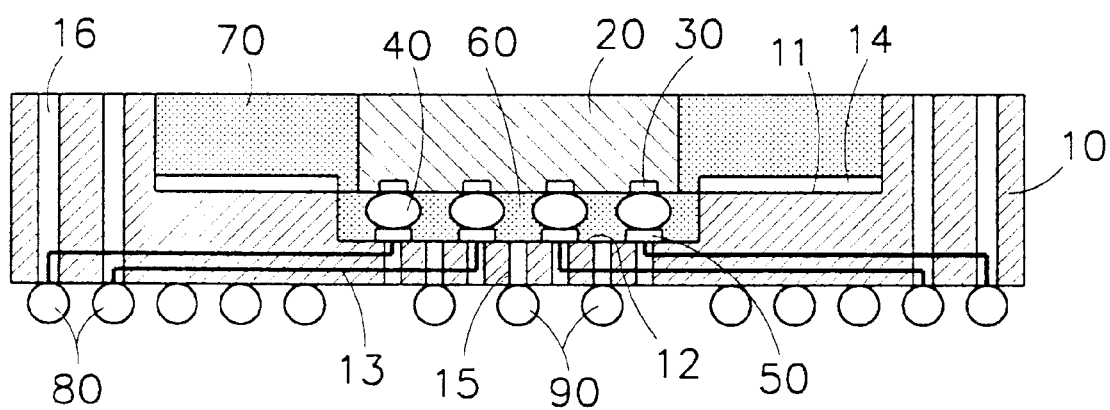

As shown in FIG. 4E, a plurality of electrically conductive balls 80, preferably solder balls, are attached on corresponding ones of the lower ends of the signal lines 13, which are exposed at the lower surface of the package body 10. Also, a plurality of dummy balls 90, preferably dummy solder balls, are mounted at corresponding ones of the lower entrances of the first and second through holes 15, 16. The term "dummy" ball is used to refer to a ball that is not attached to one of the signal lines 13.

As described above, the size and thickness of the semiconductor chip package according to the present invention is minimized by not using a substrate or metallic wires. Further, the semiconductor chip package according to the present invention can be efficiently fabricated because a wire bonding step, which requires a considerable amount of time, is excluded.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A package for housing an electronic device, comprising:

a package body;

a first cavity formed in a top surface of the package body;

a second cavity formed in a bottom surface of the first cavity;

a plurality of signal lines connecting a bottom surface of the second cavity to a bottom surface of the package body; and a plurality of first through holes extending from the bottom surface of the second cavity to the bottom surface of the package body.

2. The package in accordance with claim 1, further comprising:

a plurality of second through holes at peripheral portions of the package body and extending from the top surface of the package body to the bottom surface of the package body.

3. The package in accordance with claim 2, further comprising at least one dummy ball attached to at least one of the first and second through holes at the bottom surface of the package body.

4. The package in accordance with claim 1, further comprising a material, for improving adhesion between the package body and a molding compound, formed on a peripheral edge portion of the bottom surface of the first cavity.

5. The package in accordance with claim 4, wherein the material for improving adhesion between the package body and the molding compound comprises a metallic plate.

6. The package in accordance with claim 1, wherein portions of the signal lines are exposed at the bottom surface of the second cavity and at the bottom surface of the package body.

7. The package in accordance with claim 6, further comprising:

a plurality of anisotropic conductive members attached to the exposed portions of the signal lines at the bottom surface of the second cavity; and a plurality of electrically conductive balls attached to the exposed portions of the signal lines at the bottom surface of the package body.

8. The package body in accordance with claim 1, wherein the plurality of signal lines comprise a plurality of metallic patterns.

9. A semiconductor chip package, comprising:

a package body;

a first cavity formed in a top surface of the package body;

a second cavity formed in a bottom surface of the first cavity;

a plurality of signal lines connecting a bottom surface of the second cavity to a bottom surface of the package body;

a semiconductor chip having a plurality of bonding pads attached thereon;

a plurality of electrically conductive bumps coupling the bonding pads to corresponding ones of the signal lines; and a plurality of anisotropic conductive members attached to exposed portions of the signal lines.

10. The semiconductor chip package in accordance with claim 9, further comprising a filing agent formed in the second cavity.

11. The semiconductor chip package in accordance with claim 10, wherein an upper surface of the filling agent is substantially co-planer with the bottom surface of the first cavity.

12. The semiconductor chip package in accordance with claim 9, further comprising a molding compound formed in the first cavity.

13. The semiconductor chip package in accordance with claim 12, further comprising a material, for improving adhesion between the package body and the molding compound, formed on a peripheral edge portion of the bottom surface of the first cavity.

14. The package in accordance with claim 13, wherein the molding compound comprises an epoxy molding compound, and wherein the material for improving adhesion between the package body and the molding compound comprises a metallic plate.

15. The semiconductor chip package in accordance with claim 12, wherein a top surface of the semiconductor chip is not covered by the molding compound.

16. The semiconductor chip package in accordance with claim 15, wherein the top surface of the semiconductor chip, a peripheral edge portion of the top surface of the package body and a top surface of the molding compound are substantially co-planar.

17. The semiconductor chip package in accordance with claim 9, wherein portions of the signal lines are exposed at the bottom surface of the second cavity and at the bottom surface of the package body.

18. The semiconductor chip package of claim 17 further comprising:

a plurality of electrically conductive balls attached to the exposed portions of the signal lines at the bottom surface of the package body.

19. The semiconductor chip package in accordance with claim 9, further comprising:

a plurality of first through holes extending from the bottom surface of the second cavity to the bottom surface of the package body; and a plurality of second through holes at peripheral portions of the package body and extending from the top surface of the package body to the bottom surface of the package body.

20. The semiconductor chip package in accordance with claim 19, further comprising at least one dummy ball attached to at least one of the first and second through holes at the bottom surface of the package body.

21. The semiconductor chip package in accordance with claim 9, wherein the plurality of signal lines comprise a plurality of metallic patterns.

22. A package for housing an electronic device comprising:

a package body;

a cavity formed in a top surface of the package body;

a plurality of signal lines connecting a bottom surface of the cavity to a bottom surface of the package body; and a material, for improving adhesion between the package body and a molding compound, formed on a bottom surface of the cavity.

23. The package in accordance with claim 22, wherein the material for improving adhesion between the package body and the molding compound comprises a metallic plate.

24. The package in accordance with claim 23, wherein the cavity comprises:

a first recess formed in a top surface of the package body; and a second recess formed in a bottom surface of the first recess.

25. The package in accordance with claim 24, wherein the plurality of signal lines connect a bottom surface of the second recess to a bottom surface of the package body.

26. The package in accordance with claim 24, wherein the material for improving adhesion between the package body and the molding compound is formed on a peripheral edge portion of the bottom surface of the first recess.

27. A package for housing an electronic device comprising:

a package body;

a cavity formed in a top surface in a package body;

a plurality of signal lines connecting a bottom surface of the cavity to a bottom surface of the package body, wherein portions of the signal lines are exposed at the bottom surface of the cavity and at the bottom surface of the package body; and a plurality of anisotropic conductive members attached to the exposed portions of the signal lines at the bottom surface of the cavity.

28. The package in accordance with claim 27, wherein the cavity comprises:

a first recess formed in a top surface of the package body; and a second recess formed in a bottom surface of the first recess.

29. The package in accordance with claim 28, wherein the plurality of signal lines connect a bottom surface of the second recess to a bottom surface of the package body.

30. The package in accordance with claim 27, further comprising a plurality of electrically conductive balls attached to the exposed portions of the signal lines at the bottom surface of the package body.

31. A package for housing an electronic device, comprising:

a package body;

a cavity formed in a top surface of the package body;

a plurality of signal lines connecting a bottom surface of the cavity to a bottom surface of the package body, wherein portions of the signal lines are exposed at the bottom surface of the cavity and at the bottom surface of the package body;

a plurality of first through holes extending from the bottom surface of the second cavity to the bottom surface of the package body;

a plurality of second through holes at peripheral portions of the package body and extending from the top surface of the package body to the bottom surface of the package body; and at least one dummy ball attached to at least one of the first and second through holes at the bottom surface of the package body.

* * * * *